United States Patent [19]

Suzuki

[11] Patent Number: 4,740,697
[45] Date of Patent: Apr. 26, 1988

[54] SECONDARY ION MASS SPECTROMETER

[75] Inventor: Toshiko Suzuki, Chiba, Japan

[73] Assignee: Kawasaki Steel Corporation, Kobe, Japan

[21] Appl. No.: 788,757

[22] Filed: Oct. 18, 1985

[30] Foreign Application Priority Data

Oct. 19, 1984 [JP] Japan .................................. 59-219451

[51] Int. Cl.[4] ............................................. G01N 23/00
[52] U.S. Cl. ..................................... 250/309; 250/306; 250/397
[58] Field of Search ............... 250/306, 307, 309, 310, 250/397

[56] References Cited

U.S. PATENT DOCUMENTS 3,628,009 12/1971 Ome et al. ............................ 250/309
3,889,115 6/1975 Tamura et al. ....................... 250/309
4,132,892 1/1979 Wittmaack ........................... 250/309
4,163,153 7/1979 Tamura et al. ....................... 250/309
4,556,794 12/1985 Ward et al. .......................... 250/309

FOREIGN PATENT DOCUMENTS 26194 3/1978 Japan .................................... 250/309

OTHER PUBLICATIONS

"Positive Mass Identification on an Ion Microphobe Mass Analyzer by Use of a Digital Squarer Module." by: W. H. Gries, E. D. Rawsthorne, J. J. Strydom & K. N. Woods Pub. in International Journal of Mall Spectrometry and Ion Processes, 59 (1984) 339–342 Elsevier Science Publishers B. V. Amsterdam-Netherlands.

Primary Examiner—Bruce C. Anderson
Attorney, Agent, or Firm—Austin R. Miller

[57] ABSTRACT

In a secondary ion mass spectrograph, the electrical power supply voltages controlling and pertaining to the polarity of the target secondary ions are all switched between opposite polarities simultaneously while the deflection of the primary ion beam is automatically corrected for any error that may result from the polarity switch-over. This allows quick alternation of the polarity of target ions without loss of accuracy of the primary beam scan. The correction to the primary beam deflected may be predetermined under specific observing conditions or may be derived from theoretical considerations.

14 Claims, 5 Drawing Sheets

SECONDARY ION MASS SPECTROMETER

BACKGROUND OF THE INVENTION

The present invention relates to a secondary ion mass spectrometer and more particularly to an improvement in the secondary ion mass spectrometer, which irradiates a solid sample with an accelerated positive or negative primary ion beam suitable for analyzing the composition of a metal or a semiconductor material, which draws secondary ions released from the surface of the sample into a detection system by means of an electrical potential between the sample and the detection system and which analyzes the target composition by mass separation.

Conventional secondary ion mass spectrometer irradiates a solid sample with an accelerated positive or negative primary ion beam and draw secondary ions released from the surface of the sample by irradiation into a detection system by means on an electrical potential between the sample and the secondary ion detection system (the extraction electrical potential), and analyzes the composition of the target on the basis of the secondary ions. Such spectrometers have been used to analyze the components and the composition of metallic or semiconductive material and particularly for analysis of microareas, trace analysis, analysis of depth distributions, and analysis of two-dimensional distributions.

In the case of analyzing depth distribution by means of this secondary ion mass spectrometer, the information for a depth distribution may be obtained by continually irradiating a single point or area of the target. In the case of multielement analysis multielement information for the multi-element may be obtained by successively measuring for each atomic mass in sample. Analysis of multielement depth distribution involves repetition of this operation.

The mechanism by which secondary ions are formed in this secondary ion mass spectrometer is not well understood, but generally there is a tendency for elements having high ionization potential to become negative secondary ions, and element having low ionization potential to become positive ions. Thus, we may measure for each element with high sensitivity as either a positive or a negative ion. However, the absolute intensity of secondary ion beam itself is meaningless because the intensity of secondary ion beam is highly sensitive to the surface state of the sample and the quality of the vacuum, etc. Usually, the intensity is expressed as the ratio of the intensities of secondary ions of the subject element and of the matrix element, such as Fe in the case of steel material and Si in the case of a semiconductor material, etc. (for example, $I(M^+)/I(Fe^+)$, $I(M^{+-})/I(Si^+)$, $I(Cl^-)/I(Fe^+)$, etc.).

The secondary ion mass spectrometer consumes a very small amount of the sample during analysis, but analysis is destructive. For that reason, it constitutes a characteristic feature that it is necessary to rapidly control the mass the system of mass analysis secondary ion in order to obtain good results.

However, the extraction potential of secondary ion is constant by force in prior art secondary ion mass spectrometers. Therefore, in the prior art, it has not been possible to detect secondary ions of opposite polarity at the nearly same time, because the polarity of detected secondary ions was fixed to be positive or negative and the polarity of the secondary ions of matrix element such as $Fe^+$ or $Si^+$ or the like had to be selected so that the secondary ions can be released easily. Nevertheless, in practice it is usually important in analysis to measure the intensity of beams of the secondary ions such as $Cl^-$ or $F^-$ or the like which ionize in only the opposite polarity.

In this case, the following problems have arisen in prior art secondary ion mass spectrometers because the polarity of extraction potential of secondary ions could only be switched manually. (1) The polarity of many operating potentials, such as extraction potential of secondary ions, the electrical potential of the mass analyzing system of the secondary ions and the electrical potential of the detection system, etc., must occasionally be switched and the polarity switch takes times. Accordingly, the sample is continuously being destroyed by irradiation with primary ions while the polarity is being switched, and the measurement is interrupted during this time, or the measurement process is delayed in cases where the primary ion beam is turned off during this time. (2) The deviation of electric field which results from switching the polarity also affects the primary ion beam, and the irradiative location may shift as shown in FIGS. 10 and 11. Therefore, the primary ion beam may miss a targeted microarea, the image of a two-dimensional distribution may also be distorted, and it is impossible to carry out analysis of depth distribution of both polarities at a single point.

In FIGS. 10 and 11, 10 represents a primary ion beam generation system which produces positive (FIGS. 10 and 11) or negative primary ion beams 14 and 16 represent a solid sample and a secondary ion beam released from the surface of the sample respectively. 18 represents a mass spectro-analysis system which performs mass separation for the secondary ions released by the sample.

The conventional way to compensate for the divergence of the irradiative location of the primary beam due to switching of the polarity is to shift the sample 14 after switching, but this is time-consuming. Furthermore, it is necessary to equip the secondary ion mass spectrometer with an accurate apparatus for viewing the sample, such as an optical microscope or the like, and an accurate apparatus for slightly moving the sample. However, it has been difficult to view the sample and slightly move the sample by the conventional apparatus installed in the conventional spectrometer. It is also impossible to fully accurately correct the beam location. Furthermore, an additional problem has been that it was nearly impossible to switch the polarity repeatedly, because each polarity switch-over requires a lot of labor.

On the other hand, it is known that secondary ions of both positive and negative polarities can be measured at the same time, but in this case two mass spectroanalyzers or two secondary ion detection systems are required. Therefore, such systems have the drawbacks of being not only exceedingly expensive, but also intricate and bulky.

SUMMARY OF THE INVENTION

The present invention is to eliminate the problems in the prior art mentioned above.

Therefore, it is an object of the present invention is to provide a secondary ion mass spectrometer which can rapidly switch the polarity of the extraction potential for the secondary ions, the electric potential in the mass spectro-analyser for the secondary ions and in a detection system and so forth, and of accurately detecting both positive and negative secondary ions from the same analytic area.

Another object of the invention is to provide a secondary ion mass spectrometer which can automatically correct for the divergence of the irradiative location of the primary ion beam due to the change in electric fields resulting from the polarity switching.

A further object of the present invention is to facilitate compensation for divergence of the irradiative location of the primary ion beam by the above-mentioned compensation device which modifies the voltage applied to a deflection plate for primary beam scanning in accordance with the divergence, whereby other compensation devices are rendered unnecessary.

In order to accomplish the above-mentioned and other objects, a secondary ion mass spectrometer, according to the invention, irradiates a solid sample with a primary ion beam, draws secondary ions released from the surface of the sample into a detection system by means of an electrical potential between the sample and the detection system, and analyzes the composition of the sample by mass separation of the secondary ions. A switching device is incorporated with the secondary ion mass spectrometer, which automatically switches the polarity of all electrical sources or voltages influencing the polarity of secondary ions being detected. A compensating device is associated with the switching device for automatically correcting the irradiative direction of the primary ion beam in response to operation of the switching device to compensate for divergence of the irradiative location of the primary ion beam on the surface of the sample due to the polarity switching.

With the foregoing arrangement of the secondary ion mass spectrometer, the secondary ions produced by irradiating the sample with primary ions are of both positive and negative polarities, and positive or negative secondary ions are introduced into a mass spectro-analysis system by means of a suitable potential slope applied between the sample and the analysis system. Accordingly, we may reverse the polarity of secondary ions drawn into the analysis system by reversing the polarity of this potential slope. At the same time, we also need to reverse the polarity of the potentials in the mass spectro-analyzer for secondary ions and in a detection system. In this case, the change in the electric field between the sample and the secondary ion analysis system affects the electric field between the source of primary ions beam may change slightly. Therefore, the irradiative location of primary ion beam on the surface of the sample also moves, but we are not able to ignore this divergence because analysis of a specific microscopic area may be in progress. Accordingly, it becomes possible to alternate and rapidly measure either positive or negative secondary ions originating from the same place by compensating for the change in deflection of the primary ion beam.

According to one aspect of the invention, a secondary ion mass spectrometer comprises first means for irradiating a primary beam to a solid sample for generating secondary ions, second means for analysing composition of the sample by mass separation of the secondary ions, third means for drawing the secondary ions to be analyzed generated to the second means, fourth means for switching of electric polarity of power supply for switching polarity of the second ions, and fifth means, associated with the fourth means for controlling the first means for correcting irradiating direction of the primary beam in response to activation of the fourth means.

The fifth means is so associated as to perform control of the first means for correcting irradiating direction in syncronism with operation of the fourth means. The fifth means is detective of deviation of irradiation point from a predetermined irradiation point to derive correction value, based on which the first means is controlled for correcting irradiating direction. The correction value is composed of a direction indicative component representative of direction to shift irradiating point and a magnitude indicative component representative of shifting magnitude of shifting of the irradiation point.

The first means includes a deflection plate for controlling irradiation direction of the primary ion beam, which deflection plate is variable of irradiation direction according to variation of a control voltage applied thereto, and the fifth means applying a correction voltage corresponding to the correction value for modifying the control voltage for correcting irradiation point to the predetermined irradiation point.

According to another aspect of the invention, a process for performing mass spectroanalysis utilizing a secondary ion mass spectrometer comprises the steps of:
irradiating a primary beam to a solid sample for generating secondary ions;
drawing the secondary ions to be analyzed generated to the second means;
analysing composition of the sample by mass separation of the secondary ions;
switching of electric polarity of power supply for switching polarity of the second ions; and
controlling the first means for correcting irradiating direction of the primary beam in response to switching of polarity of the power supply.

According to a further aspect of the invention, a secondary ion mass spectrometer comprises means for irradiating a solid sample with a primary beam to a solid sample for generating secondary ions, a detection system analyzing the composition of the sample by mass separation of the secondary ions, means for drawing the secondary ions released from the sample by means of an electrical potential between the sample and the detection system, a switching device which automatically switches the polarity of all electric sources and voltages influencing the polarity of secondary ions being detected, and a compensation device which automatically corrects the direction of propagation of the primary ion beam in response to operation of the switching device to compensate for divergence of the irradiative location of the primary ion beam on the surface of the sample.

The primary beam irradiation means includes a deflection plate for controlling irradiation deflection of the primary beam, which deflection plate is controlled the irradiation direction by a control voltage applied thereto, and the compensation device applys a correction voltage which is derived on the basis of magnitude of divergence of irradiation location to modify the control voltage for the deflection plate.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment, but for explanation and understanding only.

In the drawings.

DESCRIPTION OF THE PREFERRED EMBODIMENT

Figure 1:
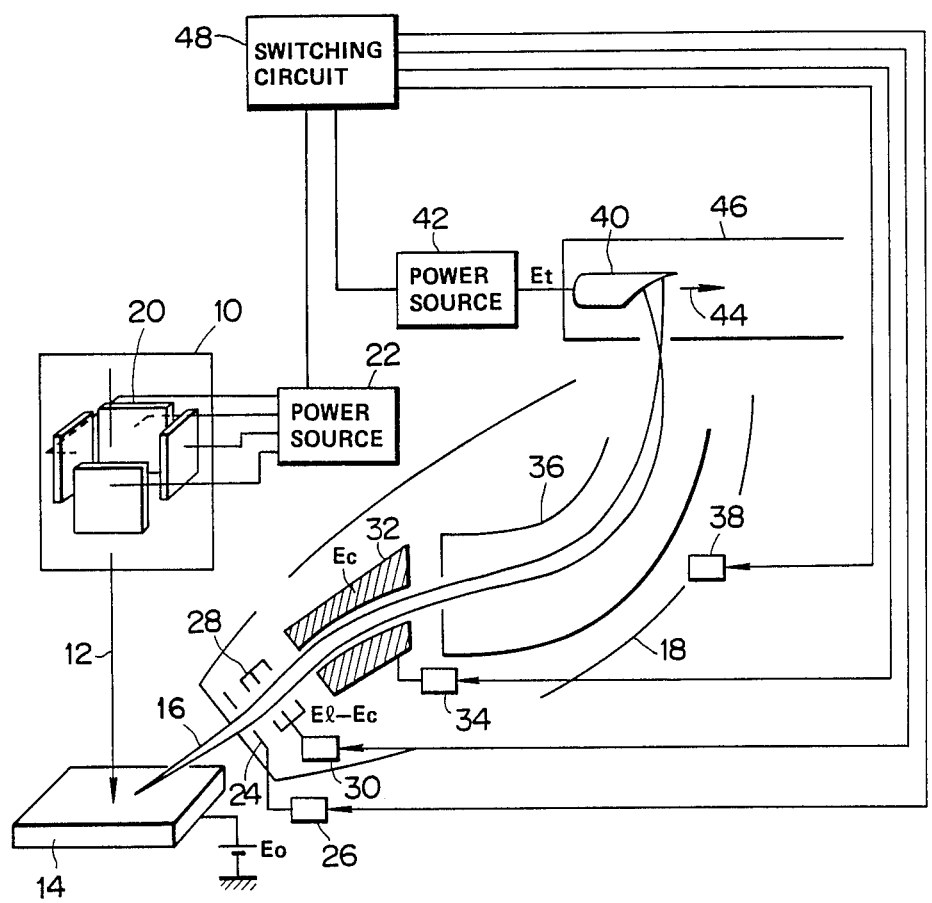
FIG. 1 is a diagram of the overall structure of the preferred embodiment of a secondary ion mass spectrometer according to the present invention, including a perspective view of the primary ion beam generator and a section through part of the secondary ion mass spectro-analyzer.
Figure 2:
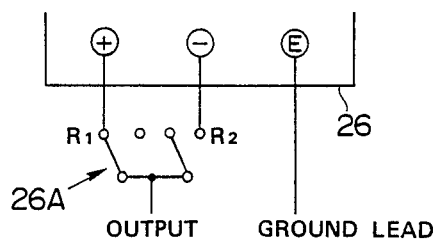
FIG. 2 is a circuit diagram of the mechanism which switches the polarity of all electrical sources in the preferred embodiment.

Referring now to FIGS. 1 to 9, the present invention will be described in terms of the preferred embodiments of the invention. FIG. 1 shows the preferred embodiment of a secondary ion mass spectrometer according to the present invention, which comprises; a generating system 10 for the primary ion beam 12 composed of a plurality of deflection plates 20 which control the direction of propagation of the primary ion beam 12, and an electrical power source 22 for the deflection plates which applies a voltage to the plates 20; a mass spectro-analysis system 18 for the secondary ions composed of a extraction electrode 24 used to draw secondary ions 16 released by the solid sample 14 irradiated by said primary ion beam 12 into the mass spectro-analysis system 18, an extraction electrical power source 26 which supplies the extraction electrode 24 with an extraction potential $E_0+\alpha$ or $E_0-\alpha$, an electrostatic lens 28 used to focus the secondary ion beam 16 drawn into the mass spectro-analysis system 18 by the extraction electrode 24, an electrical power source 30 for the lens which supplies the electrostatic lens 28 with a lens voltage E1, an electrostatic field plates 32 for separating energy of the secondary ion beam 16, an electrical power source 34 for the electrostatic field plates 32 with an electrostatic field voltages $\pm E_c$, an electromagnet 36, an electrical power source 38 which supplies the magnet 36 with electrical current for generating a magnetic field, a target 40 with which the desired secondary ions collide, an electrical power source 42 which supplies the target 40 with a electric potential $E_t$ which accelerates secondary ions in a detection system toward the target, and a detection system 46 which detects electrons 44 produced by collision of secondary ions with the target 40; and a switching circuit 48 which automatically switches the polarity of all of the electrical power sources and voltages influencing the polarity of the secondary ions being analyzed and in response to the switching, automatically corrects the direction of propagation of the primary ion beam 12 by adding a modified voltage corresponding to the divergence of the primary beam to the deflection plates for the primary ion beam so as to compensate for divergence of the irradiative location of the primary ion beam on the surface of the sample resulting from a polarity switch-over.

The switching of polarity by the switching circuit 48 is carried out by a relay that automatically controls switches, for example, the switch 26A for switching polarity of the extraction electrical power source 26 shown in FIG. 1, which control the electrical supply polarity for the electrical power sources 26, 30, 34, 38 and 42. The switching circuit 48 also adjusts the voltage on the deflection plates 20 as described below.

Figure 3:
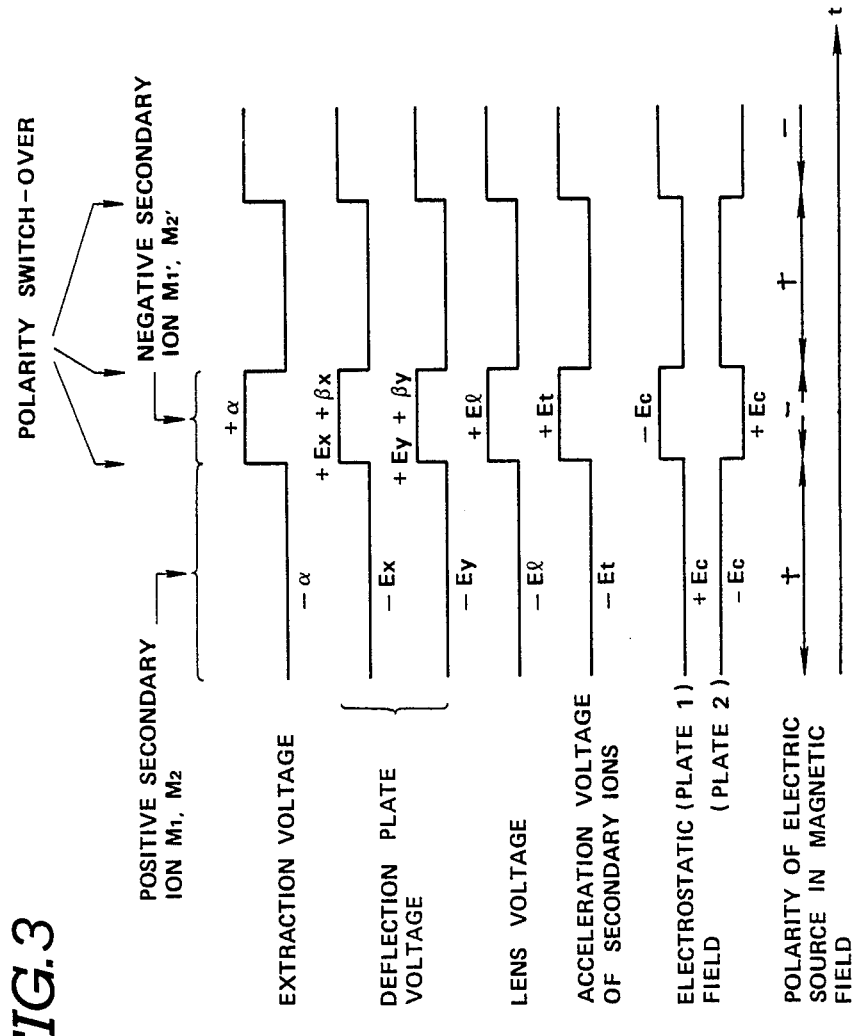
FIG. 3 is a timing diagram of the extraction voltage, voltage on the deflection plates, the lens voltage, the acceleration voltage for secondary ions in the detection system, the electrostatic field, and the polarity of electrical source of magnetic field in an exemplary state of transition.

Let the atomic mass of positive secondary ions to be detected be labelled M1, M2 (M1, M2>0), and the atomic mass of negative secondary ions, M1', M2', (M1', M2'>0). Assume also that the extraction potential relative to the electrical potential of the sample, for positive and negative secondary ions respectively, is $\pm\alpha V$ ($\alpha>0$), as shown in FIG. 3. Furthermore, let the voltage on the deflection plates 20 in the x and y directions be $E_x$ and $E_y$ respectively, where the x and y directions lie in the horizontal plane essentially perpendicular to the direction of propagation of the primary ion beam, and the amplitudes of the voltages $E_x$ and $E_y$ are functions of the acceleration voltage of the primary ion beam and the extraction voltage of the secondary ions, and the polarity of the primary ions.

First, to measure positive secondary ions of atomic mass M1, the extraction voltage is set to $-\alpha$ and the voltages on the deflection plates are set to $-E_x$ and $-E_y$. The lens voltage and the acceleration voltage for secondary ions in the detection system may be labelled $-E_l$ and $-E_t$ respectively. The electrostatic field plate voltage $E_c$ is set in this case to a so-called positive mode, as is the polarity of the electrical source 38 for the magnet 36, and the secondary ion mass spectrograph is measured after that electric current of output of the electric source 38 for the magnet is tuned. The electrical supply voltages or currents are all adjusted to enable capture of ions of atomic mass M1. After measuring the ion intensity of M1, the voltages can be adjusted for measurement of the M2 ion intensity.

Secondarily, to measure negative secondary ions of atomic mass M1', the extraction voltage is switched from $-\alpha$ to $+\alpha$, the voltage on the deflection plates is switched from $-E_x$ and $-E_y$ to $+E_x+\beta_x$ and $+E_y+\beta_y$ respectively ($\beta_x$ and $\beta_y$ are the voltage adjustments intended to cope with divergence.), the lens voltage in the secondary ion mass spectro-analyzer and the acceleration voltage for secondary ions in the detection system are switched from $-E_1$ and $-E_t$ to $+E_1$ and $+E_t$ respectively, the voltage $E_c$ in the electrostatic field is switched to negative mode and the polarity of the electric source 38 for the magnetic field is also switched to negative mode. Then the secondary ion mass spectrograph can measure the ion intensity of ions of atomic mass M1' after adjusting of the electrical output currents or voltages of the electric source 38 for the magnetic field. The mass spectrograph can then measure atomic mass M2' after suitable field re-adjustment.

Thus, it is possible to measure both positive and negative secondary ions alternatingly at the same position by simply repeating the voltage control process described above.

FIG. 3 illustrated transitions between the operating states of the extraction voltage, the voltage on the deflection plates, the lens voltage, the acceleration voltage for secondary ions in the detection system, the electrostatic field voltage, and the polarity of the magnetic field for the preferred embodiment of the present invention.

Examples of measurements performed by a mass spectrograph employing the present invention are described in detail below.

Figure 4:
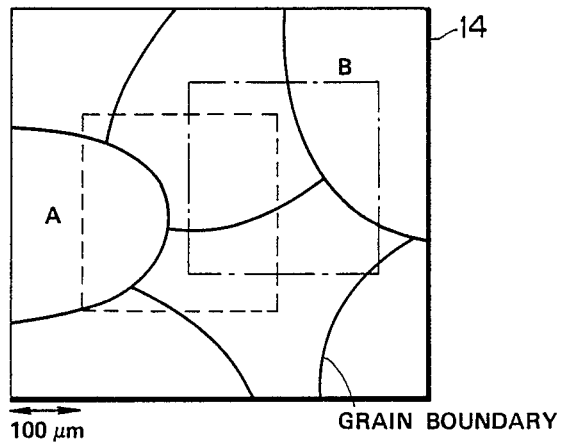
FIG. 4 is a plane figure which shows the first example of a measurement sample.
Figure 5:
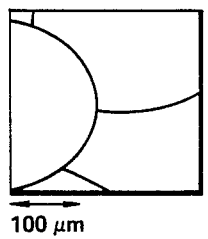
FIG. 5 is a plan view of the $K^+$-ion image recorded by a prior art method from the first example of a measurement sample.
Figure 6:
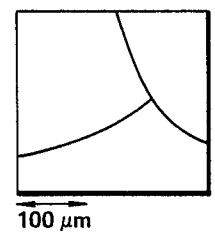
FIG. 6 is a plan view which shows a misleading $Cl^-$-ion image in the same case.

In first example of measurement shown in FIGS. 4 through 6, a sample shown in FIG. 4 has KCl concentrated along its grain boundaries. In this case, K and Cl are detected as $K^+$ and $Cl^-$ respectively. First, when $K^+$ is measured by the prior art method, the ion image shown in FIG. 5 is obtained from the area of primary beam scan A shown in FIG. 4. Next, when the polarity of the extraction potential and so forth are all reversed and re-adjusted, and the of $Cl^-$ ion image is measured; the ion image shown in FIG. 6 is obtained. In this case, the irradiative location of primary beam and thus the scanning area were shifted to the area B as shown in FIG. 4. Comparing the ion images of FIGS. 5 and 6, K and Cl seem to have been concentrated in different places. In order to compensate for the divergence of the irradiative location of the primary beam by moving the sample itself, an apparatus to move the sample slightly under observation at high magnification is required, and it is difficult and time-consuming to carry out this very accurate compensation. However, if the present invention is employed, the sample does not need to be shifted at all and measurement of opposite polarities is rapid and very accurate because the switching of the polarities of all of the electrical sources and voltage attendant on the conversion of the polarity of detected secondary ion is carried out automatically.

Figure 7:
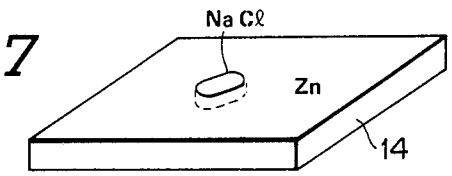
FIG. 7 is a perspective view of a second exemplary sample.
Figure 8:
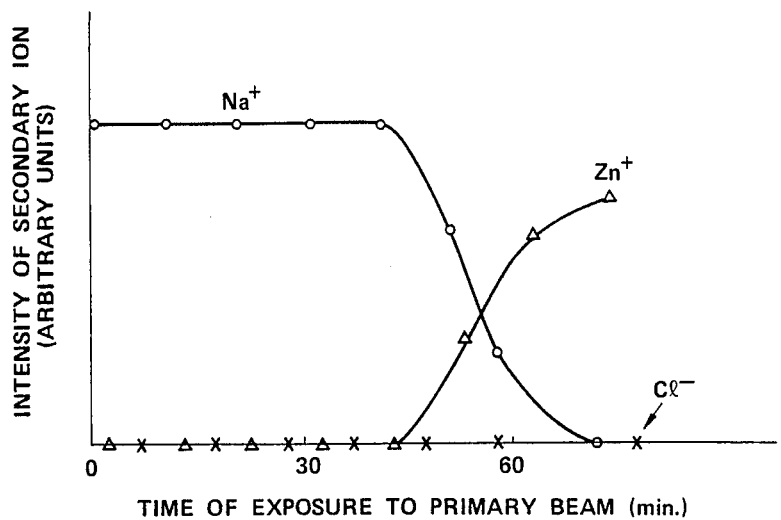
FIG. 8 is a graph of the results of analysis of depth distribution in the case of prior art method applied to the second exemplary sample.
Figure 9:
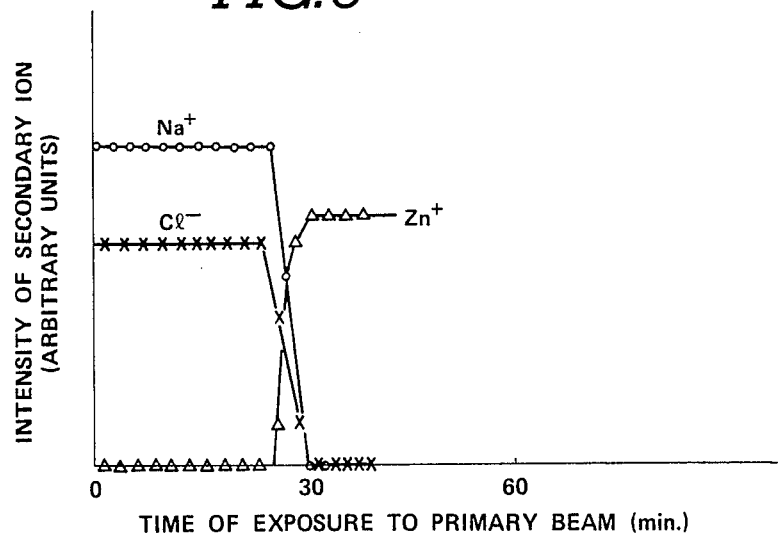
FIG. 9 is a graph of the results of analysis of depth distribution in the case of the present method applied to the second exemplary sample.
Figure 10:
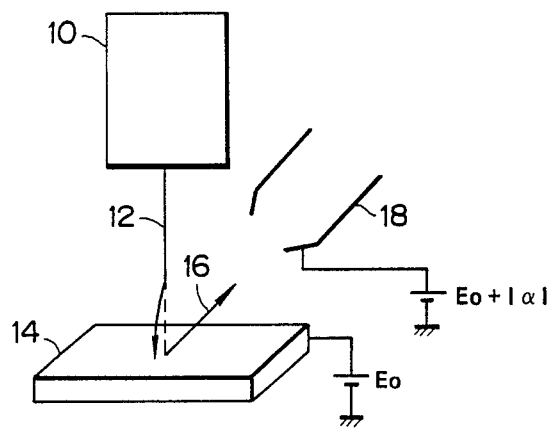
FIGS. 10 and 11 are diagrams illustrating divergence of the irradiative location of the primary beam in the prior art due to change of the polarity of the extraction voltage.
Figure 11:
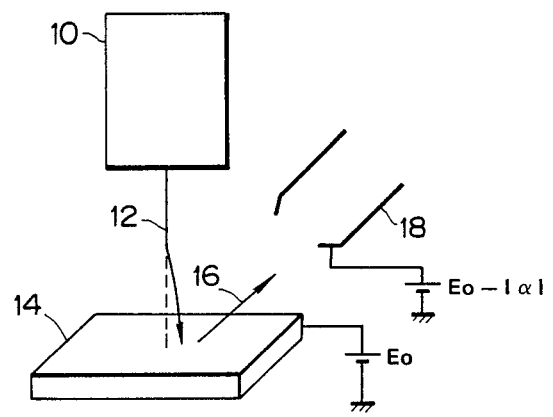

In second example of measurement, analysis of the depth-direction of NaCl which separated out of Zn galvanizing is performed on the sample shown in FIG. 7. In this case, the sample set up so that the center of scanning area of the primary beam coincides with the center of the contaminant in prior art method. The primary ion is $O_2^+$ and acceleration voltage is 20 KV. $Na^+$ and $Zn^+$ were measured in positive secondary ion mode. Then when the system was switched manually to the negative mode to measure $Cl^-$, the irradiative location of primary ion beam diverged 150 μm in the x-direction onto the Zn region. Therefore, secondary ions of $Cl^-$ appearead to be completely absent. The results are shown in FIG. 8.

The accuracy of the analysis of depth-direction was inferior because the measurement of the ion intensity of the secondary ion $Cl^-$ was interrupted during the polarity switch-over, the intervals between measurement of the ion intensities of different secondary ions were relatively long, and therefore the resultant information was rough. In the case of FIG. 8, the depth distribution was about 2000 Å. Furthermore, each time it was switched to negative mode, primary beam diverged from the target. Therefore, the results were that the $Cl^-$ ion intensity was not measured at all and only $Na^+$ appeared to have separated out of the Zn layer. This is contrary to the facts. In analysis of depth-direction, the depth of penetration is directly proportional to the time of exposure to the primary beam, provided a uniform material. However, in the prior art measurement, primary beam impinges on the Zn layer in the negative mode and destruction of NaCl is interrupted during these periods. Consequently, Na (separated material on Zn; as a matter of fact, it is NaCl, but in prior art method, it must be concluded that it is Na.) appears to condense to a relative great thickness.

Then, the intensity of secondary ion of $Na^+$ was measured by using the same primary ion conditions as in the prior art example ($O_2^+$, acceleration voltage 20 KV) but employing the present invention. The measurement was carried out at an extraction voltage of $-1.5$ KV and with the center of scan of the primary beam centered over the NaCl area in the positive mode. The $Zn^+$ ion intensity was measured continuously. Then, the polarity switch-over was carried out automatically so that the extraction voltage was adjusted to $+1.5$ KV. The irradiative location of primary beam shifted 150 μm in the x-direction as a result of this adjustment. To compensate for this, the modification potentials $\beta_x$ and $\beta_y$ 30 V in the x-direction and 0 V in the y-direction (there was no shift in the y-direction) were applied to the deflection plates 20. These quantities are obtained by prior measurement of the divergence of the beam by means of observation of the ion image, an optical microscope, a fluorescent screen or the like. It is also possible to obtain the modification voltages as functions of the divergence theoretically.

In the present invention, this compensation is automatically performed by means of a switching circuit 48. Accordingly, the correcting voltages $\beta_x=30$ V and $\beta_y=0$ V are applied to the deflection plates simultaneously with the polarity switch-over from positive to negative, and their inverses are applied when switching from negative to positive, so that the primary beam is held on target at all times. Thus, in the inventive example, the $Cl^-$ ion intensity can be measured and a truly linear relationship between time of exposure to the primary beam sputtered and depth is evident, in FIG. 9. In the present invention, analysis of depth-direction was very accurate, with measurements taken at intervals of about 500 Å. Thus it could be ascertained that the contaminant in the Zn was NaCl. It could also be calculated that the thickness of the NaCl was about 1 μm on the basis of the intensity of the primary beam, the scanning area, and the exposure time to the primary beam.

The preferred embodiments of the present invention have been applied to secondary ion mass spectrometers of the magnetic field type, but the field of application of the present invention is not limited to this and it should be clear that the present invention is similarly suitable for application to secondary ion mass spectrometers of the quadrapole type which have a low extraction voltage and have an easier polarity switch-over than magnetic types.

As previously mentioned, not only can the polarities of all of the electrical sources or voltages taking part in the change of the polarity of detected secondary ions, be switched quickly, but also the irradiation location of the primary ion beam can be automatically corrected for any deflection accompanying the polarity switch-over when the present invention is employed. Therefore, it is not necessary to compensate for divergence by slight moving the sample, and it becomes possible to rapidly and accurately measured the secondary ion ion intensities for ions of opposite polarity. Thus, it is possible to quantitatively use the intensity of negative secondary ions, and the field of application of mass spectro-analysis of secondary ions can expand. Further, the present invention have the additional advantage of being easily adapted to existing prior art apparatus.

What is claimed is:

1. A secondary ion mass spectrometer comprising:
    first means for irradiating a primary beam to a solid sample for generating secondary ions;
    second means for analysing the composition of said sample by mass separation of said secondary ions;
    third means for drawing said secondary ions to be analyzed generated to said second means;
    fourth means for switching of the electric polarity of the power supplies for switching polarity of said secondary ions; and
    fifth means, associated with said fourth means for controlling said first means for correcting the irradiating direction of said primary beam in response to activation of said fourth means.

2. The spectrometer as set forth in claim 1, wherein said fifth means is so associated as to perform control of said first means for correcting the irradiating direction in synchronism with operation of said fourth means.

3. The spectrometer as set forth in claim 1, wherein said fifth means is detective of the deviation of irradiation point from a predetermined irradiation point to derive a correction value, based on which said first means is controlled for correcting irradiating direction.

4. The spectrometer as set forth in claim 3, wherein said first means includes a deflection plate for controlling the irradiation direction of said primary ion beam, which deflection plate is variable of irradiation direction according to variation of a control voltage applied thereto, and said fifth means applying a correction voltage corresponding to said correction value for modifying said control voltage for correcting the irradiation point to said predetermined irradiation point.

5. In a secondary ion mass spectrometer, a process for performing mass spectroanalysis comprising the steps of:
    irradiating a primary beam to a solid sample for generating secondary ions;
    drawing said secondary ions to be analyzed;
    analysing the composition of said sample by mass separation of said secondary ions;
    switching of the electric polarity of the power supplies for switching the polarity of said secondary ions; and
    correcting the irradiating direction of said primary beam in response to switching of polarity of said power supply.

6. The process as set forth in claim 5, wherein said irradiation controlling step is carried out in synchronism with switching of polarity of said power supply.

7. The process as set forth in claim 5, wherein, in said irradiation controlling step, detection of deviation of the irradiation point from a predetermined irradiation point is performed in order to derive a correction value, based on which correction is made of the irradiating direction for shifting the irradiation point to said predetermined irradiation point.

8. The process as set forth in claim 7, wherein said correction value is composed of a direction indicative component representative of a direction to shift the irradiating point and a magnitude indicative component representative of shifting the magnitude of shifting of the irradiation point.

9. A secondary ion mass spectrometer comprising:
    means for irradiating a solid sample with a primary beam to a solid sample for generating secondary ions;
    a detection system positioned for analyzing the composition of the sample by mass separation of said secondary ions;
    means for drawing said secondary ions released from the sample by means of an electrical potential between the sample and the detection system;
    a switching device which automatically switches the polarity of all electric sources and voltages influencing the polarity of secondary ions being detected; and
    a compensation device which automatically corrects the direction of propagation of the primary ion beam in response to operation of the switching device to compensate for divergence of the irradiative location of the primary ion beam on the surface of the sample.

10. The spectrometer as set forth in claim 9, wherein said primary beam irradiation means includes a deflection plate for controlling the irradiation direction of said primary beam, which deflection plate is controlled as to the irradiation direction by a control voltage applied thereto, and said compensation device applies a correction voltage which is derived on the basis of magnitude of divergence of irradiation location to modify said control voltage for said deflection plate.

11. A secondary ion mass spectrometer having a power supply and a location wherein a solid sample is positioned, providing a sampling and analyzing area, said spectrometer comprising:
    generating means in said area for irradiating a primary beam in a given direction to said solid sample for generating secondary ions, wherein charges are developed which have a tendency undesirably to divert the direction of said primary beam in said area;
    analyzing means positioned adjacent said area in said spectrometer arranged and connected for analyzing the composition of said sample by mass separation of said secondary ions;
    drawing means operative and effective for drawing said secondary ions to be analyzed and generated from said sample area to said analyzing means;
    switching means connected to said power supply for switching the electric polarity of said power supply for switching the polarity of said secondary ions; and
    control means associated with said switching means for controlling said generating means for correcting the irradiating direction of said primary beam in response to activation of said switching means.

12. The spectrometer as set forth in claim 11, wherein said control means is so associated as to perform control of said generating means for correcting the irradiating direction in synchronism with operation of said fourth means.

13. The spectrometer as set forth in claim 11, wherein said control means is detective of deviation of the irradiation point from a predetermined irradiation point to derive a correction value, based on which said generating means is controlled for correcting irradiating direction.

14. The spectrometer as set forth in claim 13, wherein said generating means includes a deflection plate for controlling the irradiation direction of said primary ion beam, which deflection plate is variable of irradiation direction according to variation of a control voltage applied thereto, and said control means applying a correction voltage corresponding to said correction value for modifying said control voltage for correcting the irradiation point to said predetermined irradiation point.

* * * * *